United States Patent
Takeguchi

(10) Patent No.: US 9,401,279 B2
(45) Date of Patent: Jul. 26, 2016

(54) TRANSISTOR GATE AND PROCESS FOR MAKING TRANSISTOR GATE

(71) Applicant: SanDisk Technologies Inc., Plano, TX (US)

(72) Inventor: Naoki Takeguchi, Yokkaichi (JP)

(73) Assignee: SanDisk Technologies LLC, Plano, TX (US)

(*) Notice: Subject to any disclaimer, the term of this patent is extended or adjusted under 35 U.S.C. 154(b) by 189 days.

(21) Appl. No.: 13/918,648

(22) Filed: Jun. 14, 2013

(65) Prior Publication Data

US 2014/0367804 A1    Dec. 18, 2014

(51) Int. Cl.
| | |
|---|---|
| *H01L 21/28* | (2006.01) |
| *H01L 21/285* | (2006.01) |
| *H01L 29/78* | (2006.01) |
| *H01L 29/49* | (2006.01) |

(52) U.S. Cl.
CPC .... *H01L 21/28088* (2013.01); *H01L 21/28097* (2013.01); *H01L 21/28512* (2013.01); *H01L 29/4941* (2013.01); *H01L 29/78* (2013.01); *H01L 21/28052* (2013.01)

(58) Field of Classification Search
CPC .................. H01L 21/82345; H01L 21/28052; H01L 21/28061; H01L 21/28097; H01L 21/28079; H01L 21/2807; H01L 21/823443; H01L 21/823835; H01L 21/823842; H01L 29/4916; H01L 29/4933; H01L 29/4941
See application file for complete search history.

(56) References Cited

U.S. PATENT DOCUMENTS

| | | |
|---|---|---|
| 5,518,958 A | 5/1996 | Giewont et al. |
| 5,719,410 A | 2/1998 | Suehiro et al. |
| 5,796,151 A | 8/1998 | Hsu et al. |
| 5,796,166 A | 8/1998 | Agnello et al. |
| 5,887,145 A | 3/1999 | Harari et al. |
| 5,925,918 A | 7/1999 | Wu et al. |
| 5,942,356 A | 8/1999 | Mitsui et al. |
| 5,998,290 A | 12/1999 | Wu et al. |
| 6,075,274 A | 6/2000 | Wu et al. |
| 6,107,171 A | 8/2000 | Tsai |
| 6,208,003 B1 | 3/2001 | Miura |
| 6,271,590 B1 | 8/2001 | Akram et al. |
| 6,306,743 B1 | 10/2001 | Lee |
| 6,333,250 B1 | 12/2001 | Kim |
| 6,376,325 B1 | 4/2002 | Koo |
| 6,514,842 B1 | 2/2003 | Prall et al. |
| 6,551,878 B2 | 4/2003 | Clampitt et al. |
| 6,555,865 B2 | 4/2003 | Lee et al. |

(Continued)

FOREIGN PATENT DOCUMENTS

WO    WO 2004/027824    4/2004

OTHER PUBLICATIONS

Notification of Transmittal of the International Search Report and the Written Opinion of the International Searching Authority, or the Declaration for Int'l Application No. PCT/US2014/038375 mailed Aug. 13, 2014, 10 pages.

*Primary Examiner* — Steven Loke
*Assistant Examiner* — Leslie Pilar Cruz
(74) *Attorney, Agent, or Firm* — Davis Wright Tremaine LLP

(57) ABSTRACT

A transistor gate is formed of a stack of layers including a polysilicon layer and a tungsten layer separated by a barrier layer. A titanium layer reduces interface resistance. A tungsten liner reduces sheet resistance. The tungsten liner, a tungsten nitride barrier layer, and the tungsten layer may be formed sequentially in the same chamber.

6 Claims, 4 Drawing Sheets

(56) References Cited

U.S. PATENT DOCUMENTS

| | | |
|---|---|---|
| 6,688,584 B2 | 2/2004 | Iyer et al. |
| 6,744,108 B1 | 6/2004 | Pan |
| 6,800,543 B2 | 10/2004 | Taguwa |
| 6,872,639 B2 | 3/2005 | DeBoer et al. |
| 6,875,679 B2 | 4/2005 | Agarwal |
| 6,902,993 B2 | 6/2005 | Blosse et al. |
| 6,911,381 B2 | 6/2005 | Agarwal et al. |
| 6,943,416 B2 | 9/2005 | Hu |
| 7,582,924 B2 | 9/2009 | Lee et al. |
| 7,902,614 B2 | 3/2011 | Lim et al. |
| 2001/0054729 A1 | 12/2001 | Divakaruni et al. |
| 2002/0011636 A1 | 1/2002 | Hayashi et al. |
| 2002/0072156 A1 | 6/2002 | Lee et al. |
| 2003/0043637 A1* | 3/2003 | Forbes .................. H01L 27/115 365/185.33 |
| 2003/0170942 A1 | 9/2003 | Taguwa |
| 2004/0195603 A1 | 10/2004 | Ito |
| 2004/0207030 A1 | 10/2004 | McTeer |
| 2004/0219746 A1 | 11/2004 | Vaartstra et al. |
| 2005/0074957 A1 | 4/2005 | Ho et al. |
| 2005/0110058 A1 | 5/2005 | Hu |
| 2005/0124127 A1 | 6/2005 | Ho et al. |
| 2005/0212036 A1 | 9/2005 | Tanaka et al. |
| 2006/0024894 A1 | 2/2006 | Hong |
| 2006/0180875 A1 | 8/2006 | Park et al. |
| 2006/0197225 A1 | 9/2006 | Pan et al. |
| 2006/0244084 A1 | 11/2006 | Lee et al. |
| 2006/0284264 A1 | 12/2006 | Taguwa |
| 2007/0001241 A1 | 1/2007 | Lim et al. |
| 2007/0001246 A1 | 1/2007 | Lim et al. |
| 2007/0034964 A1 | 2/2007 | Park et al. |
| 2007/0066013 A1 | 3/2007 | Lim et al. |
| 2008/0157383 A1* | 7/2008 | Lim et al. ...................... 257/763 |
| 2009/0149033 A1 | 6/2009 | Vaartstra et al. |

* cited by examiner

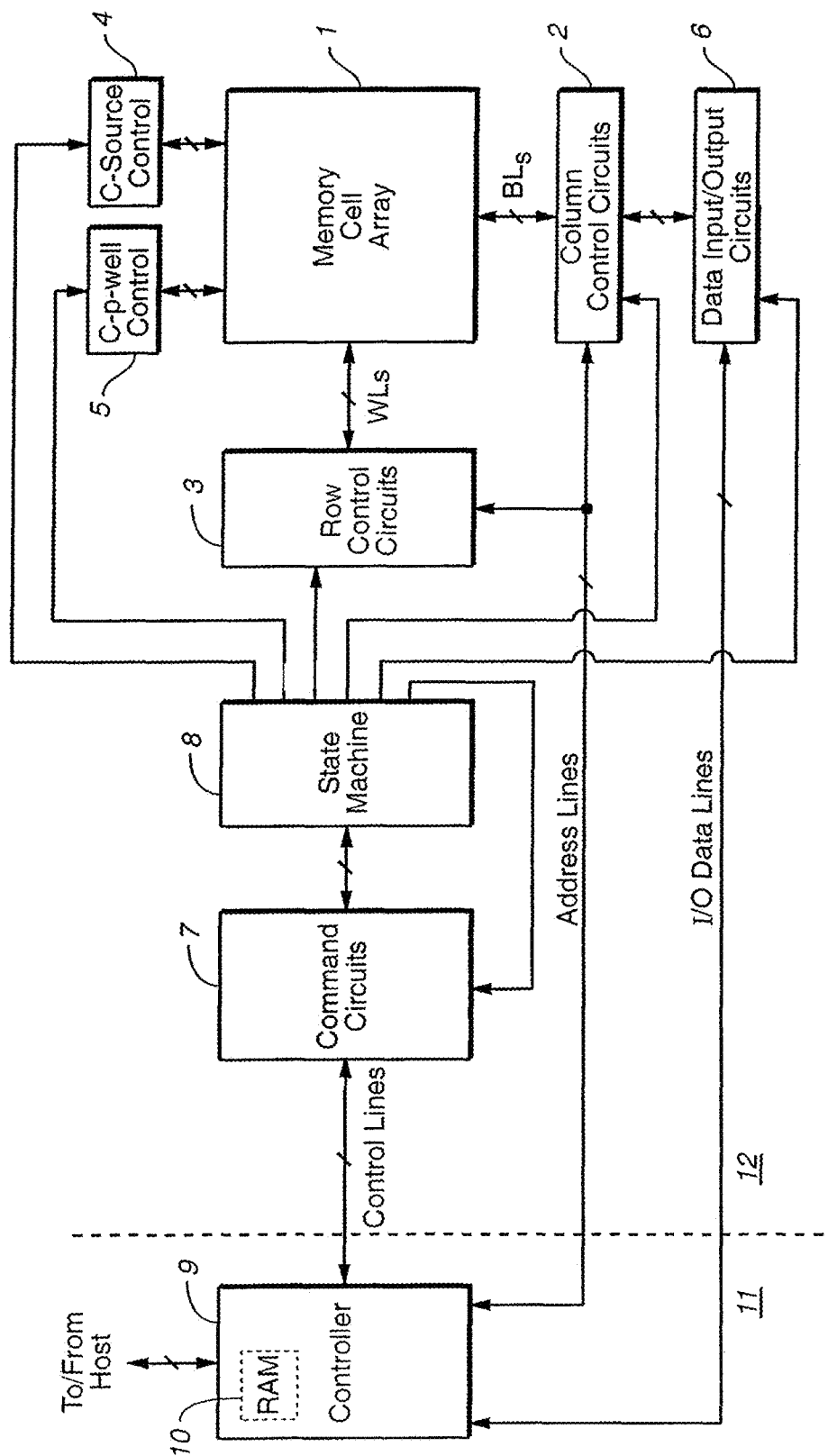
FIG._1
(Prior Art)

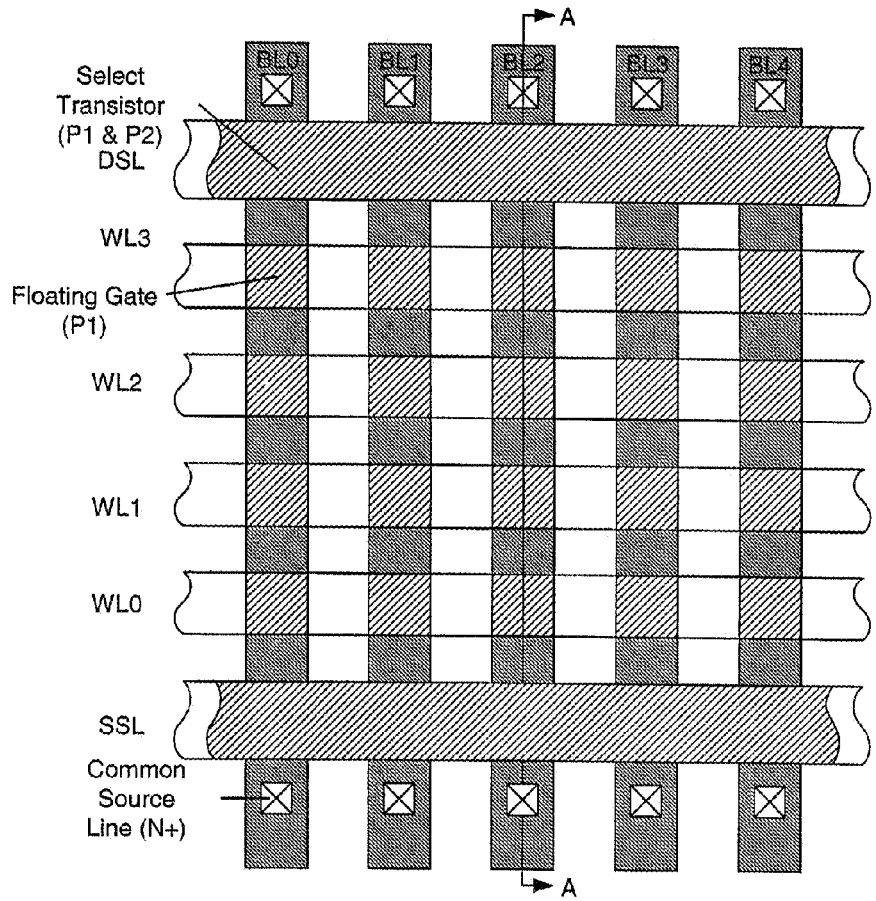
FIG._2A (PRIOR ART)
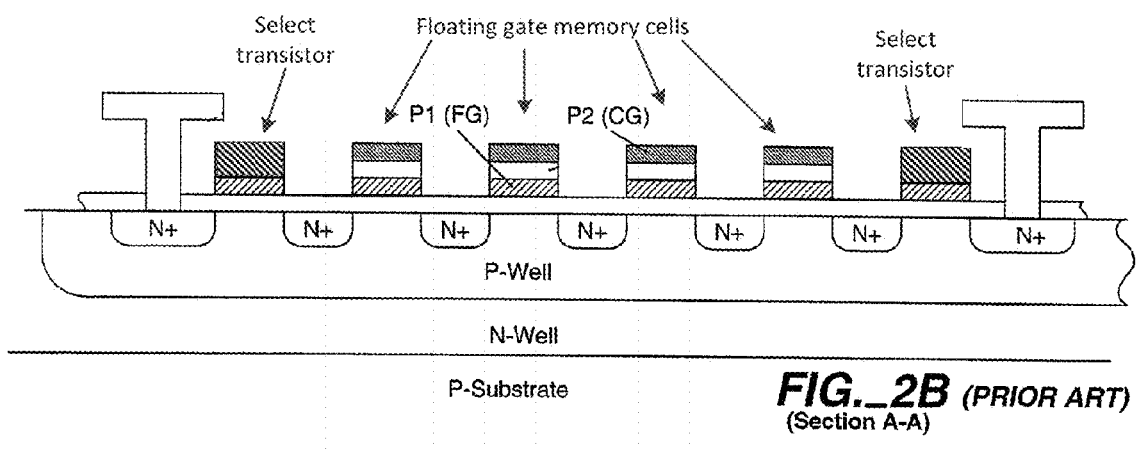
FIG._2B (PRIOR ART)
(Section A-A)

TRANSISTOR GATE AND PROCESS FOR MAKING TRANSISTOR GATE

BACKGROUND OF THE INVENTION

This invention relates generally to semiconductor devices, their formation, structure and use, and specifically to methods of making transistor gates in nonvolatile memory integrated circuits.

Integrated circuits commonly include transistors. Many transistors have gates formed of a stack of materials that also form some wiring that connects the gates to other components. Examples of such arrangements are present in logic integrated circuits and in memory integrated circuits, including flash memory integrated circuits.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string select lines DSL and SSL extend across multiple strings over rows of floating gates.

The top and bottom of the string connect to the bit line and a common source line respectively through select transistors (source select transistor and drain select transistor) as shown in FIG. 2B. Unlike memory cells, these transistors do not generally include floating gates. The gates of select transistors are electrically driven from the periphery through select lines that may extend over significant distances so that resistance of such lines is a concern. Transistors in peripheral circuits are also formed without floating gates and may also be controlled using lines that have significant resistance. Accordingly, there is a need for a transistor gate structure that can provide low resistance and for methods of forming such transistor gate structures in an efficient manner.

SUMMARY OF THE INVENTION

A transistor gate stack includes a polysilicon layer and a tungsten layer separated by a barrier layer. A titanium (or other silicide metal) layer between the polysilicon layer and the barrier layer reduces interface resistance but increases sheet resistance. A tungsten liner between the titanium layer and the barrier layer allows the use of the titanium layer with little or no increase in sheet resistance. The tungsten liner, a tungsten nitride barrier layer, and the tungsten layer may be formed in the same Physical Vapor Deposition (PVD) chamber, for example by sputtering a tungsten target to form tungsten layers, and adding nitrogen gas during sputtering to form tungsten nitride.

An example of a transistor gate structure includes: a doped polysilicon layer; a silicide metal layer overlying the doped polysilicon layer; a first tungsten layer overlying the silicide metal layer; a barrier layer overlying the silicide metal layer; and a second tungsten layer overlying the barrier layer.

The silicide metal layer may comprise titanium. The silicide metal layer may comprise yttrium, or nickel. The barrier layer may comprise tungsten nitride. The barrier layer may comprise tungsten nitride deposited by Physical Vapor Deposition (PVD).

An example of a method of forming a transistor gate structure includes: depositing a doped polysilicon layer over a gate dielectric; depositing a silicide metal layer over the doped polysilicon layer; depositing a first tungsten layer over the silicide metal layer; depositing a barrier layer over the silicide metal layer; and depositing a second tungsten layer over the barrier layer.

Depositing the barrier layer may include depositing tungsten nitride or titanium nitride. The first tungsten layer, the barrier layer, and the second tungsten layer may be deposited in the same tool. The barrier layer may comprise tungsten nitride and the first tungsten layer, the barrier layer, and the second tungsten layer may be deposited in the same chamber of the same tool. The chamber may be a Physical Vapor Deposition (PVD) chamber and the first tungsten layer, the barrier layer, and the second tungsten layer may be deposited by sputtering. The first tungsten layer, the barrier layer, and the second tungsten layer may be deposited using a tungsten target, and nitrogen gas may be introduced into the chamber during the deposition of the barrier layer. The silicide metal layer may be deposited in the same tool. A patterned hard mask layer may subsequently be formed and subsequent etching may be performed with the hard mask layer in place to form individual gates.

An example of a method of forming a transistor gate structure includes: depositing a gate dielectric layer over a substrate surface; depositing a doped polysilicon layer over the gate dielectric layer; depositing a titanium layer overlying the doped polysilicon layer; depositing a first tungsten layer over the titanium layer by sputtering; depositing a metal nitride layer over the silicide metal layer by sputtering; and depositing a second tungsten layer over the metal nitride layer by sputtering.

The metal nitride may be tungsten nitride. The first tungsten layer, the metal nitride layer, and the second tungsten layer may be deposited sequentially by deposition in a sputtering chamber with a tungsten target. The titanium layer may be deposited in another chamber that is on the same tool as the sputtering chamber. The titanium layer may be deposited to a thickness of about one nanometer, the first tungsten layer may be deposited to a thickness of more than one nanometer, and the metal nitride layer may be deposited to a thickness of more than three nanometers.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 1 is a block diagram of a prior art memory system.
FIG. 2A is a plan view of a prior art NAND array.
FIG. 2B is a cross-sectional view of the prior art NAND array of FIG. 2A taken along the line A-A.

DETAILED DESCRIPTION OF EXEMPLARY EMBODIMENTS

Memory System

Figure 3:
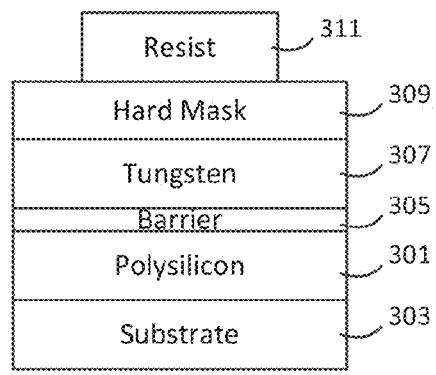
FIG. 3 shows a prior art gate stack.

An example of a prior art memory system, which may be modified to include various aspects of the present invention, is illustrated by the block diagram of FIG. 1. A memory cell array 1 including a plurality of memory cells M arranged in a matrix has peripheral circuits that allow access to the memory array. A column control circuit 2, a row control circuit 3, a c-source control circuit 4 and a c-p-well control circuit 5 are provided to supply appropriate voltages to access selected memory cells. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

Memory chips such as memory chip 12 generally include many transistors with unitary gates (transistors that do not have floating gates). For example, select gates at either end of a NAND string and transistors in peripheral circuits such as shown in FIG. 1 generally have unitary gates. Such gates may be formed of doped polysilicon, metal, metal silicide, or some combination of conductive layers. Transistors with unitary gates are used in a variety of other integrated circuits including memory controller chips and other logic chips.

FIG. 3 shows a prior art example of formation of a gate of such a transistor. A blanket layer of doped polysilicon 301 is deposited over a substrate 303 (an intervening gate dielectric layer, or layers, is omitted in FIG. 3). A barrier layer 305 overlies the polysilicon and separates it from a tungsten (W) layer 307. Barrier layer 305 between polysilicon layer 301 and tungsten layer 307 may be formed of tungsten nitride or titanium nitride for example. Tungsten nitride deposited by Physical Vapor Deposition "PVD" has been found to be an effective barrier. The barrier layer prevents silicidation of tungsten, i.e. the formation of tungsten silicide as a result of interaction with the silicon of the polysilicon layer.

Figure 4:
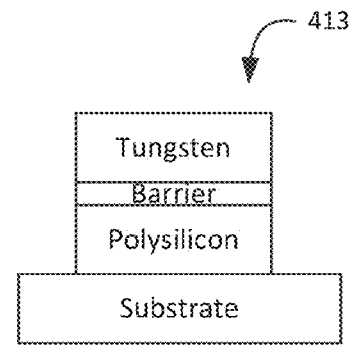
FIG. 4 shows the prior art gate stack of FIG. 3 after patterning.

A hard mask layer 309 overlies the tungsten layer 307 and a resist layer is formed (e.g. spun on) on the hard mask layer and is patterned (e.g. by photolithography) to form resist portions such as the resist portion 311 shown. Subsequently, the pattern of the resist portions is transferred to the hard mask layer thus forming corresponding hard mask portions. The hard mask portions are then used as an etch mask during an anisotropic etch step (e.g. using Reactive Ion Etch, or "RIE"). This results in the formation of a gate 413 as shown in FIG. 4. The series of layers that are deposited and etched to make such a gate form a stack that may be referred to as a "gate stack." Selecting appropriate materials for a gate stack has implications for efficient operation of the integrated circuit.

Figure 5:
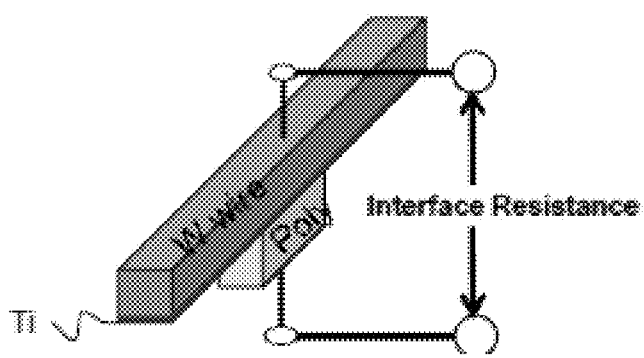
FIG. 5 illustrates interface resistance in a gate stack.

FIG. 5 illustrates one important characteristic of a gate stack, the resistance of the stack in the vertical direction, which contributes to power consumed by the transistor. An important contribution to the resistance of the stack is from interface resistance between materials (resistance of the tungsten, barrier, and polysilicon layers are relatively low in the vertical direction because of their large cross sectional area compared with their thickness). It has been found that the addition of a silicide metal such as titanium can significantly reduce interface resistance in such a stack.

Figure 6:
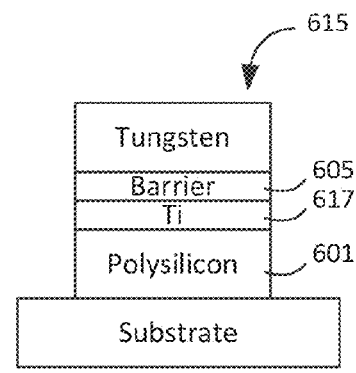
FIG. 6 shows an example of a gate stack that includes a titanium layer.

FIG. 6 shows a cross section of a gate stack 615 that includes a titanium layer 617 between a polysilicon layer 601 and a barrier layer 605. In other examples a different silicide metal may be used instead of titanium, to reduce interface resistance, such as yttrium, nickel, or cobalt.

Figure 7:
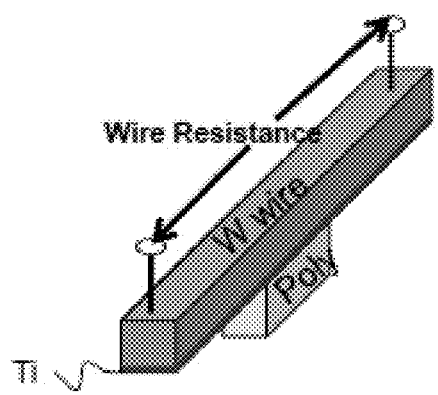
FIG. 7 illustrates wire resistance of a line formed from a gate stack.

FIG. 7 illustrates another important characteristic of a gate stack, the resistance along a wire made from the gate stack, which depends on the geometry of such a wire and the sheet resistance of the gate stack. It has been found that a stack such as shown in FIG. 6 may have high sheet resistance as a result of including a titanium layer because tungsten grain size is affected by the titanium. For example, the addition of a titanium layer to a gate stack may result in sheet resistance that is two to three times higher than a gate stack that does not have such a titanium layer. The titanium layer appears to cause overlying tungsten to be formed with small grains and therefore high sheet resistance. Thus, although adding a titanium layer to a stack may improve interface resistance, this generally comes at the expense of increased sheet resistance.

Figure 8:
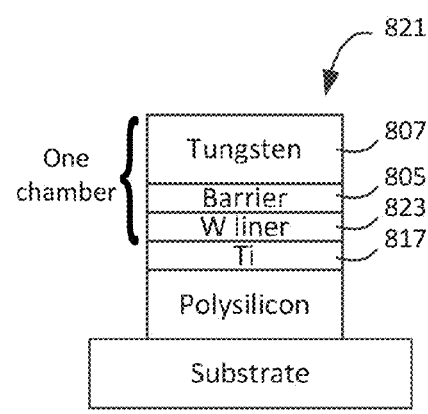
FIG. 8 shows an example of a gate stack that includes a tungsten liner.

FIG. 8 shows a cross section of a gate stack 821 that has both good interface resistance and good sheet resistance. In this example, a tungsten liner 823 is added between a titanium layer 817 and a barrier layer 805. The addition of a tungsten liner reduces or eliminates the effect of the titanium layer on grain size in the tungsten layer.

While various materials may be used for barrier layer 805, the use of tungsten nitride (WN) is convenient because this layer is formed between the tungsten liner layer 823 and the tungsten layer 807. In one example, all three of these layers (W liner layer 823, WN barrier 805, and W layer 807) may be formed sequentially in the same chamber, for example a PVD chamber. In one example, a sputtering chamber with a tungsten target may be used to sputter tungsten to form the tungsten liner. Then, sputtering may continue in the chamber with the addition of nitrogen into the sputtering chamber so that a tungsten nitride barrier layer is formed. Then, the flow of nitrogen is stopped and sputtering of tungsten forms the tungsten layer.

Figure 9:
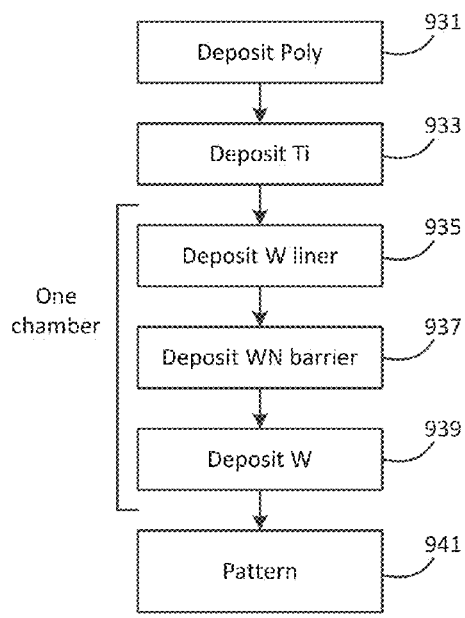
FIG. 9 shows a process for forming a gate stack.

FIG. 9 illustrates the formation of a gate stack such as described above. A polysilicon layer is deposited 931 over a substrate that has a gate dielectric layer such as a gate oxide. This may be done using a furnace or other conventional method. Then, a titanium layer is deposited 933 on the polysilicon to reduce interface resistance. Titanium may be deposited by PVD or otherwise (e.g. Chemical Vapor Deposition, CVD). Then, the substrate is sent to a tungsten sputtering chamber that is equipped with a controllable nitrogen supply. The tungsten liner is deposited 935, then the tungsten nitride barrier layer is deposited 937, and then the tungsten layer is deposited 939, in sequence, in the same chamber. In some cases, the titanium may be deposited in a separate chamber that is part of the same system. For example, a cluster tool may have a PVD chamber with a titanium target for depositing the titanium layer and another PVD chamber with a tungsten target and a nitrogen supply to deposit the liner, barrier, and tungsten layers. Substrates may be transferred between these chambers under vacuum so that no contamination is introduced between these layers and a high throughput is maintained. Subsequent to deposition of the tungsten layer 939, the substrate may be removed from the PVD deposition system and may be patterned 941 as before (e.g. using a hard mask layer followed by resist patterning).

Figure 10:
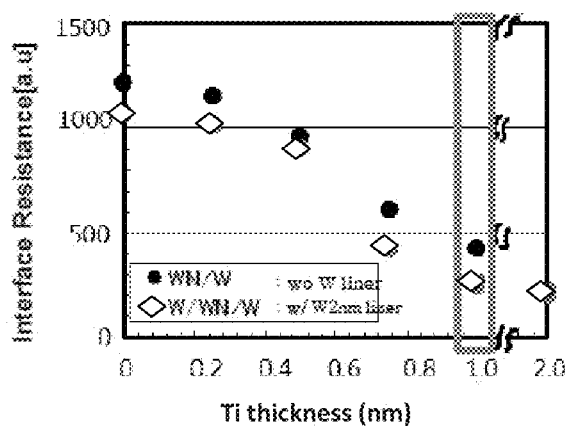
FIG. 10 shows interface resistance as a function of titanium thickness for two gate stacks, one with, and one without a tungsten liner.

FIG. 10 shows how interface resistance is somewhat lower with a tungsten liner than without. Interface resistance is shown on the vertical axis (in arbitrary units) and titanium thickness is shown along the horizontal axis. It can be seen that for a titanium layer thickness of 1.0 nm, which is sufficient to reduce interface resistance by more than half (from over 1000 to less than 500), the addition of a 2 nm thick tungsten liner reduces interface resistance by about another 25% compared with not using a tungsten liner.

Figure 11:
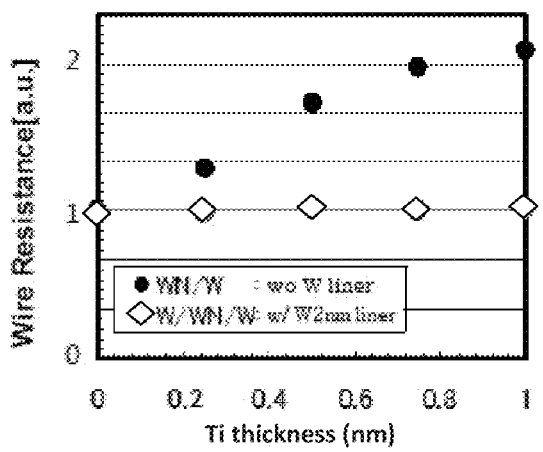
FIG. 11 shows wire resistance as a function of titanium thickness for two gate stacks, one with, and one without a tungsten liner.

FIG. 11 shows how sheet resistance is significantly lower with a tungsten liner than without. Wire resistance is shown on the vertical axis (in arbitrary units) and titanium thickness is again shown along the horizontal axis. It can be seen that as titanium thickness increases, the wire resistance increases significantly for the example without a tungsten liner (as tungsten grain size is negatively impacted by the titanium layer). In contrast, when a 2 nm thick tungsten liner is provided, the wire resistance remains the same regardless of titanium thickness. Thus, the negative impact of the titanium layer on sheet resistance is overcome by the addition of a tungsten liner.

In general, any suitable layer thicknesses may be used. For example, the titanium layer may be 1 nm, the tungsten liner layer may be greater than 1 nm (e.g. 2 nm), and the barrier tungsten nitride layer may be greater than 3 nm (e.g. 5 nm). While this form of gate stack may be used in nonvolatile memory integrated circuits, its use is not limited to nonvolatile memories or memories in general. Transistors may be formed in any integrated circuit so that they have gates as described above. Furthermore, other fabrication schemes may be used to produce the gate stack shown.

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A transistor gate structure comprising:
a doped polysilicon layer;
a silicide metal layer overlying the doped polysilicon layer;
a first tungsten (W) layer overlying the silicide metal layer;
a barrier layer overlying the silicide metal layer, wherein the barrier layer consists of tungsten nitride (WN) deposited by Physical Vapor Deposition (PVD);
a second tungsten (W) layer overlying the barrier layer; and
wherein the first tungsten layer and the second tungsten layer consist of tungsten (W) deposited by PVD.

2. The transistor gate structure of claim 1 wherein the silicide metal layer comprises titanium (Ti).

3. The transistor gate structure of claim 1 wherein the silicide metal layer comprises yttrium.

4. The transistor gate structure of claim 1 wherein the first tungsten (W) layer lies in direct physical contact with the silicide metal layer.

5. The transistor gate structure of claim 1 wherein the barrier layer is formed of tungsten nitride (WN) by sputtering a tungsten target with nitrogen, and the first and second tungsten (W) layers are formed by sputtering the tungsten target without nitrogen.

6. A transistor gate structure comprising:
a doped polysilicon layer;
a silicide metal layer overlying the doped polysilicon layer;
a first tungsten (W) layer overlying the silicide metal layer;
a barrier layer overlying the silicide metal layer; and
a second tungsten (W) layer overlying the barrier layer:
wherein:
the silicide metal layer comprises titanium (Ti) in direct physical contact with the doped polysilicon layer;
the first tungsten (W) layer lies in direct physical contact with the silicide metal layer;
the barrier layer consists of tungsten nitride (WN) lying in direct physical contact with the first tungsten (W) layer; and
the second tungsten (W) layer lies in direct physical contact with the barrier layer.

* * * * *